United States Patent [19]

Schmidt et al.

[11] Patent Number: 5,134,056
[45] Date of Patent: Jul. 28, 1992

[54] METHOD FOR APPLYING A SOLDER RESIST LAYER TO A PRINTED CIRCUIT BOARD

[75] Inventors: Hans-Fr. Schmidt, Eurasburg; Helmut Hadwiger; Milan Prochazka, both of Munich, all of Fed. Rep. of Germany; Eddy Roelants, Asse, Belgium

[73] Assignee: Siemens Aktiengesellschaft, Munich, Fed. Rep. of Germany

[21] Appl. No.: 631,944

[22] Filed: Dec. 21, 1990

[30] Foreign Application Priority Data

Dec. 22, 1989 [DE] Fed. Rep. of Germany ....... 3942742

[51] Int. Cl.$^5$ ............................................. G03F 7/26
[52] U.S. Cl. ....................................... 430/313; 430/317; 430/329; 430/330; 427/96
[58] Field of Search ............... 430/313, 315, 317, 328, 430/246, 329, 330; 427/96

[56] References Cited

U.S. PATENT DOCUMENTS

| | | | |
|---|---|---|---|
| 4,180,604 | 12/1979 | Feng | 427/96 |
| 4,459,320 | 7/1984 | Fefferman | 427/96 |
| 4,608,274 | 8/1986 | Woofen | 427/96 |
| 4,673,458 | 6/1987 | Ishikawa et al. | 430/313 |
| 4,689,657 | 8/1987 | Percival et al. | 357/40 |
| 4,745,045 | 5/1988 | Fredericks et al. | 430/313 |
| 4,966,827 | 10/1990 | Sullivan | 430/330 |

Primary Examiner—Marion E. McCamish
Assistant Examiner—Kathleen Duda
Attorney, Agent, or Firm—Hill, Van Santen, Steadman & Simpson

[57] ABSTRACT

A solder resist and a positively-acting photoresist are successively applied on a surface-wide basis onto a printed circuit board, whereupon the photoresist is selectively exposed and developed in the region of plated-through holes and/or solder pads of a printed conductor pattern carried on the printed circuit board, preferably with the assistance of laser beams. Subsequently, the solder resist is stripped in the regions not protected by the photoresist, i.e. in the regions of plated-through holes and/or solder pads and, as a last step, the remaining photoresist is likewise stripped. The method is particularly suited for the application of a solder resist layer onto three-dimensional printed circuit boards since traditional mask techniques for structuring the solder resist cannot be employed with respect to three-dimensional printed circuit boards.

21 Claims, 1 Drawing Sheet

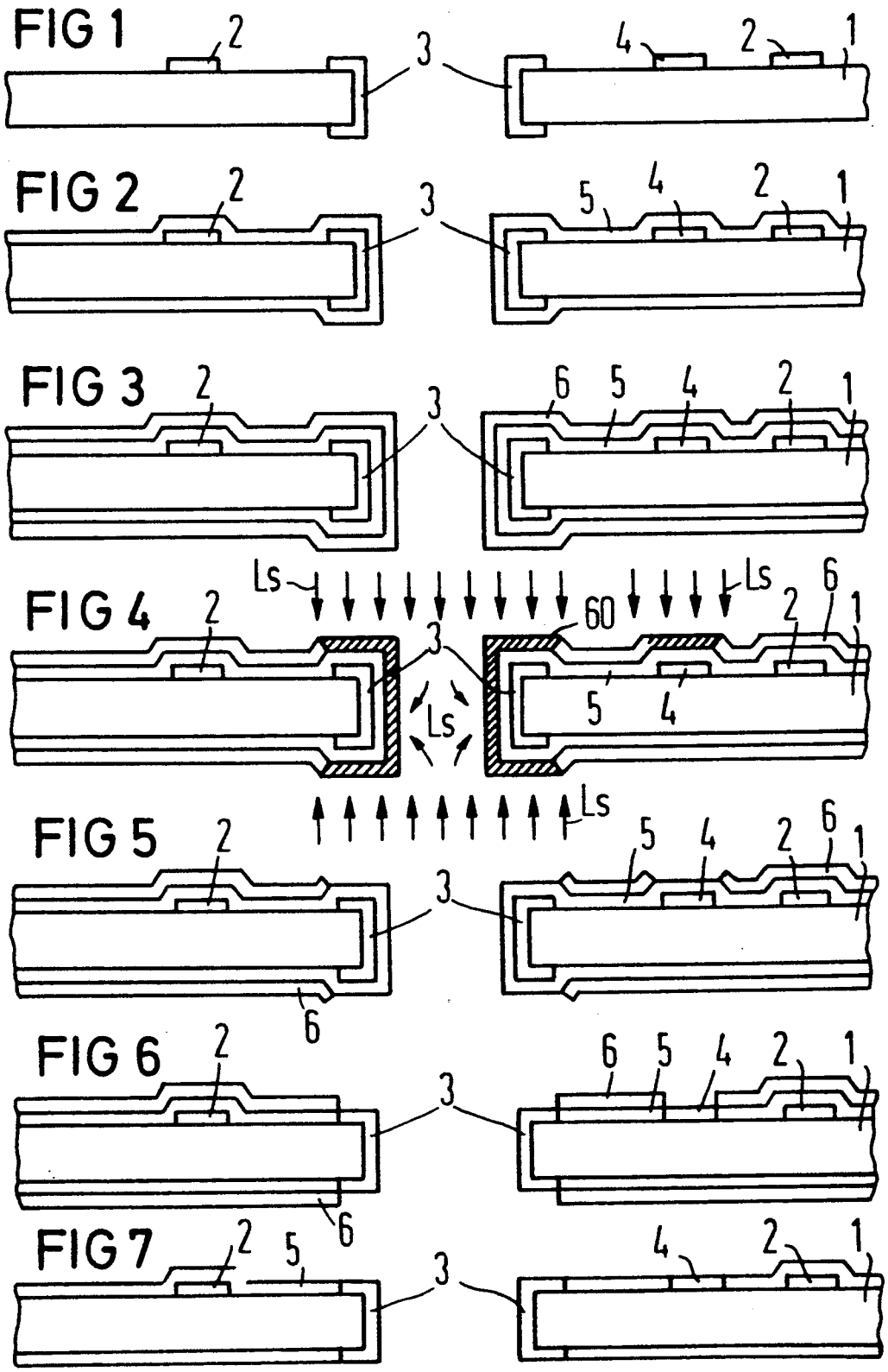

METHOD FOR APPLYING A SOLDER RESIST LAYER TO A PRINTED CIRCUIT BOARD

CROSS REFERENCE TO RELATED APPLICATION

This application is related to an application Ser. No. 07/631,943 filed Dec. 21, 1990.

BACKGROUND OF THE INVENTION

1. Field of the Invention

The present invention relates to a method for applying a solder resist layer into a printed conductor pattern of a printed circuit board, particularly a three-dimensional printed circuit board, while leaving plated-through holes and/or solder pads free.

2. Description of the Prior Art

In the manufacture of printed circuit boards, a solder resist layer should be applied onto those regions of the printed conductor pattern that should not enter into a solder connection, this being carried out after the structuring of the printed conductor pattern. The solder resist layer only leaves plated-through holes and/or solder pads free, so that an ultimate solderable surface can be produced thereat by hot tinning or by a remelting process. The application of the solder resist layer can thereby be undertaken by selective application of a solder resist onto the regions to be protected or by a surface-wide application of a light-sensitive solder resist having subsequent photostructuring. Selective application thereby involves too much expense, whereby the photostructuring cannot be implemented with traditional masks techniques, particularly given three-dimensional printed circuit boards.

SUMMARY OF THE INVENTION

The object of the present invention is to provide an economical method for applying a solder resist layer onto printed circuit boards, and that can be employed given three-dimensional printed circuit boards.

This object is achieved, according to the present invention, by a method which includes the steps:
(a) a solder resist is applied over the entire surface of a printed circuit board;
(b) a positively-acting photoresist is applied over the entire surface of the solder resist;
(c) the photoresist is selectively exposed and developed in the region of plated-through holes and/or solder pads;
(d) the regions of the solder resist uncovered in the previous step of exposing and developing are stripped; and
(e) the photoresist is stripped.

In the method of the present invention, therefore, the application of the solder resist layer occurs by a surface-wide application of a normal solder resist and subsequent, selective removal or, respectively, stripping of this solder resist in the region of plated-through holes and/or solder pads. This procedure is enabled by the corresponding photostructuring of a positively-acting photoresist that serves a protective mask for the remaining regions of the solder resist during the stripping of the undesired regions of the solder resist. By employing the positively-acting photoresist, proven techniques can be utilized for structuring the solder resist, these also being capable of implementation, without problems, even given three-dimensional printed circuit boards. It must thereby be particularly emphasized that adequate exposure and developing of the photoresist, as well as stripping of the solder resist, can be implemented without difficulties, even in the critical interior region of plated-through holes. The disadvantages of photostructuring light-sensitive solder resist can therefore be avoided by employing normal solder resist in combination with a positively-acting photoresist.

After the stripping of the photoresist, the solder resist can be thermally cured without problems.

According to a preferred development of the method of the invention, and as a feature of the invention, the selective exposure of the photoresist in the region of the plated-through holes and/or solder pads is undertaken with the assistance of a laser. In particular, the laser beams can be directly pointed into the plated-through holes and can provide a faultless exposure of the photoresist therein. The movement of the laser beam relative to the printed circuit board should be preferably freely programmable, i.e. the tracing and exposure of plated-through holes and/or solder pads can be undertaken in a particularly simple manner.

According to a further, preferred development of the invention, and a specific feature thereof, the regions of the solder resist uncovered by the developing process are simultaneously stripped with the developer employed in the step of exposing and developing the regions of plated-through holes and/or solder pads. In this case, the developing of the photoresist and the stripping of the solder resist are therefore implemented in one work step.

The advantages of the method of the present invention particularly come to bear when the solder resist is applied onto a printed circuit board having a three-dimensional, injection-molded substrate and injected plated-through holes.

BRIEF DESCRIPTION OF THE DRAWING

Other objects, features and advantages of the invention, its organization, construction and operation will be best understood from the following detailed description, taken in conjunction with the accompanying drawings, on which:

FIGS. 1–7 are highly-simplified, schematic illustrations of the various method stages in the application of a solder resist layer onto a printed circuit board in accordance with the present invention.

DESCRIPTION OF THE PREFERRED EMBODIMENTS

Before a more detailed description of the invention, it should also be pointed out that the term "printed circuit board" as well as the simplified drawing initially allow one to assume a planar structure. The advantages of the method of the present invention, however, wherein standard mask techniques can be foregone, may be precisely seen therein that one can deviate from the planar form and three-dimensional printed circuit boards having arbitrary, angled or curved shapes can be provided with a solder resist layer.

Referring to FIG. 1, a schematic sectional representation through a portion of a printed circuit board is illustrated on whose electrically-insulating substrate 1, interconnects 2, plated-through holes 3 and solder pads 4 were applied as portions of a printed conductor pattern. The illustrated substrate 1 involves a matter of an injection-molded base material having injected holes for the plated-through holes 3. For example, glass fiber reinforced polyetherimide is suitable as a material for such a substrate 1.

For applying a solder resist layer onto the conductor pattern of the printed circuit board 1 shown in excerpted form in FIG. 1, while leaving plated-through holes 3 and solder pads 4 free of solder resist for later soldering, a layer of solder resist 5 is first applied over the entire surface of the substrate 1 by dipping or by electrostatic spraying according to FIG. 2. This solder resist 5 that, for example, is applied with a thickness in the range of 20–30 μm is a matter of a commercially-available product and may comprise an epoxy resin, for example the product of the Peters Company, D-4152 Kempen, Federal Republic of Germany, available under the designation ELPEMER 2468.

After the application of the solder resist 5, a positively-acting photoresist 6 is applied over the entire surface of the solder resist 5 by dipping, spraying or the like in accordance with FIG. 3. The photoresist 6 is a matter of a commercially-available product that becomes easily soluble by photochemical decomposition due to conversion of functional groups. For example, such photoresists are utilized as etch resist in the manufacture of printed circuit boards. For example, the photoresist distributed by Farbwerke HoechstAG 6230 Frankfurt (Main) 80, Federal Republic of Germany, and distributed under the designation OZATEC is suitable.

According to FIG. 4, the photoresist 6 is subsequently exposed in the regions of the plated-through holes 3 and of the solder pads 4 with the assistance of a laser in a scan method, whereby the laser emission is merely indicated by arrows Ls. The arrows within the interior of the plated-through holes 3 are intended to indicate that the exposure of the photoresist 6 in the region of the wall of the hole can be improved by an oblique incidence of the laser beams Ls. The exposed regions of the photoresist 6 are seen as blackening, as shown as hatching in FIG. 4, and are identified with the reference character 60.

According to FIG. 5, the regions 60 of the photoresist 6 that have become soluble due to the exposure are removed. This removal of the regions 60 is implemented using a standard developer which may comprise an organic solvent.

At the end of the developing process, the regions of the solder resist 5 that are now uncovered are stripped according to FIG. 6. In other words, this means that the solder resist 5 is again removed in the region of the plated-through holes 3 and of the solder pads 4. The selective stripping of the solder resist 5, for example, is undertaken in an aqueous alkaline solution, preferably in an aqueous KOH solution. The unexposed photoresist 6 is resistant to such aqueous alkaline solutions. However, it is also possible to employ a solder resist 5 which is strippable with organic solvents such as, for example, butyldiglycol, whereby the further resist 6 in this case must be resistant to such organic solvents. For example, a solder resist distributed by the Peters Company, D-4152 Kempen, Federal Republic of Germany, under the designation ELPEMER 2469 is suitable in combination with the photoresist designated as AZ 1400 of Farbwerke HoechstAG, 6230 Frankfurt (Main) 80, Federal Republic of Germany, that can be developed and stripped in aqueous alkaline solutions. Alternatively to the disclosed stripping of the solder resist 5, removal thereof, however, can also be undertaken with the developer for the exposed regions of the photoresist 6, i.e. a method step can be eliminated in this case.

After the selective removal of the solder resist 5, then only the remaining, unexposed regions of the photoresist 6 still have to be removed. After this removal of the photoresist 6 in a commercially-available stripper, only those regions of the solder resist 5 that completely cover the printed conductor pattern 4 leaving the plated-through holes 3 and the solder pads 4 free of solder resist, then remain according to FIG. 7. These remaining regions of the solder resist 5 are then thermally cured at a temperature of approximately 120° C. for approximately 30 minutes. By subsequent hot tinning, the plated-through holes 3 and the solder pads 4 can then be selectively coated, without problems, with a tin-lead alloy. When an ultimate solderable surface has already been applied by electro-deposition of tin or of a tin-lead alloy onto the printed circuit board on the interconnects 2, plated-through holes 3 and the solder pads 4 thereof before the surface-wide application of the solder resist 5, then only a remelting process is still required for improving the solderability in the regions of the plated-through holes 3 and the solder pads 4.

Although we have described our invention by reference to particular illustrative embodiments thereof, many changes and modifications of the invention may become apparent to those skilled in the art without departing from the spirit and scope of the invention. We therefore intend to include within the patent warranted hereon all such changes and modifications as may reasonably and properly be included within the scope of our contribution to the art.

We claim:

1. A method for applying a solder resist layer onto a printed circuit board while leaving solder pads and plated-through holes as solderable elements of a printed conductor pattern carried on the printed circuit board free of the solder resist, comprising the steps of:
   (a) applying a layer of solder resist onto the printed circuit board to cover the printed conductor pattern;
   (b) applying a layer of positively-acting photoresist to cover the layer of solder resist;
   (c) selectively exposing regions of the photoresist layer which lie above the solderable elements with light;
   (d) removing the exposed regions of the photoresist layer and the solder resist therebelow; and
   (e) removing the unexposed regions of the photoresist with a stripper solution.

2. The method of claim 1, wherein the step (a) of applying a layer of solder resist is further defined as:
   (a1) applying a layer of thermally-curable solder resist; and further comprising the step of:
   (f) after the step (e), heating the printed circuit board to cure the remaining solder resist.

3. The method of claim 2, wherein the step (f) of heating is further defined as:
   (f1) heating the printed circuit board at a temperature of 120° C. for 30 minutes.

4. The method of claim 1, wherein the step (a) of applying a layer of solder resist is further defined as:
   (a1) applying the solder resist to a thickness in the range of 20–30 μm.

5. The method of claim 1, wherein the step (a) of applying a layer of solder resist is further defined as:
   (a1) dipping the printed circuit board into a bath of the solder resist.

6. The method of claim 1, wherein the step (a) of applying a layer of solder resist is further defined as:

(a1) spraying the printed circuit board with the solder resist.

7. The method of claim 1, wherein the step (b) of applying a layer of positively-acting photoresist is further defined as:
(b1) dipping the solder-resist covered printed circuit board into a bath of the photoresist.

8. The method of claim 1, wherein the step (b) of applying a layer of positively-acting photoresist is further defined as:
(b1) spraying the printed circuit board with the photoresist to cover the solder resist thereon.

9. The method of claim 1, wherein the step (c) of selectively exposing is further defined as:
(c1) selectively radiating the regions with a laser beam.

10. The method of claim 1, wherein the step (c) of selectively exposing is further defined as:
(c1) operating a laser device in accordance with a predetermined scan program to control tracing and exposure by a laser beam.

11. The method of claim 1, wherein the step (d) of removing the exposed regions and the solder resist therebelow is further defined as:
(d1) applying a developer to remove the exposed regions.

12. The method of claim 11, wherein the step (d) of removing the exposed regions and the solder resist therebelow is further defined as comprising the step of:
(d2) applying a stripper to remove the regions of solder resist uncovered by the removal of the exposed regions of photoresist in the step (d1).

13. The method of claim 11, wherein the step (d) of removing the exposed regions and the solder resist therebelow is further defined as comprising the step of:
(d2) applying an aqueous alkaline solution to remove the regions of solder resist uncovered by the removal of the exposed regions of photoresist in the step (d1).

14. The method of claim 11, wherein the step (d) of removing the exposed regions and the solder resist therebelow is further defined as comprising the step of:
(d2) applying an organic solvent to remove the regions of solder resist uncovered by the removal of the exposed regions of photoresist in the step (d1).

15. The method of claim 11, wherein the step (d) of removing the exposed regions and the solder resist therebelow is further defined as comprising the step of:
(d2) applying butyldiglycol to remove the regions of solder resist undercovered by the removal of the exposed regions of photoresist in the step (d1).

16. The method of claim 1, wherein the step (d) of removing the exposed regions and the solder resist therebelow is further defined as:
(d1) applying an organic solvent to the exposed regions and to the solder resist therebelow.

17. The method of claim 1, wherein the step (d) of removing is further defined as:
(d1) removing the exposed regions and the solder resist therebelow by applying a developing solution which is common to dissolve both the exposed photoresist and the solder resist.

18. A method for applying a solder resist layer onto a printed circuit board while leaving solder pads and plated-through holes as solderable elements of a printed conductor pattern carried on the printed circuit board free of the solder resist, comprising the steps of:
(a) applying a layer of solder resist over and to cover a surface of the printed circuit board including the printed conductor pattern and at a thickness in the range of 20–30 $\mu$m;
(b) applying a layer of positively-acting photoresist to cover the layer of solder resist;
(c) operating a laser beam emitting device in accordance with a predetermined scan program to trace and expose the regions of the photoresist which lie above the solderable elements;
(d) removing the exposed regions of photoresist by developing the same in an organic developer;
(e) stripping the regions of solder resist uncovered by removal of the exposed regions by applying an organic solvent thereto; and
(f) removing the unexposed photoresist with a stripper solution.

19. The method of claim 18, wherein the step (a) of applying a layer of solder resist is further defined as:
(a1) applying a heat-curable solder resist; and further comprising the step of:
(g) heating the printed circuit board at a predetermined temperature for a predetermined time to cure the solder resist.

20. A method for applying a solder resist layer onto a printed circuit board while leaving solder pads and plated-through holes as solderable elements of a printed conductor pattern carried on the printed circuit board free of the solder resist, comprising the steps of:
(a) applying a layer of solder resist which is soluble in a predetermined developer to cover a surface of the printed circuit board including the printed conductor pattern and at a thickness in the range of 20–30 $\mu$m;
(b) applying a layer of positively-acting photoresist, which is also soluble when exposed to radiation, in the predetermined developer to cover the layer of solder resist;
(c) operating a laser beam emitting device in accordance with a predetermined scan program to trace and expose the regions of the photoresist which lie above the solderable elements to the radiation of the laser beam;
(d) removing the exposed regions of photoresist and the uncovered regions of solder resist therebelow by developing the dissolving the same with the predetermined developer; and
(e) removing the unexposed photoresist with a stripper solution.

21. The method of claim 20, wherein the step (a) of applying a layer of solder resist is further defined as:
(a1) applying a heat-curable solder resist; and further comprising the step of:
(g) heating the printed circuit board at a predetermined temperature for a predetermined time to cure the solder resist.

* * * * *